United States Patent
Kanahira

(10) Patent No.: US 9,500,326 B2
(45) Date of Patent: Nov. 22, 2016

(54) REDUCED-BLUE-LIGHT LED LIGHTING DEVICE, METHOD OF ITS MANUFACTURE, AND LED LIGHTING METHOD

(71) Applicant: ASAHI RUBBER INC., Saitama-shi, Saitama (JP)

(72) Inventor: Takashi Kanahira, Saitama (JP)

(73) Assignee: ASAHI RUBBER INC., Saitama-shi (JP)

( * ) Notice: Subject to any disclaimer, the term of this patent is extended or adjusted under 35 U.S.C. 154(b) by 221 days.

(21) Appl. No.: 14/229,888

(22) Filed: Mar. 29, 2014

(65) Prior Publication Data

US 2014/0293608 A1    Oct. 2, 2014

(30) Foreign Application Priority Data

Mar. 29, 2013   (JP) .................. 2013-075380

(51) Int. Cl.
*F21K 99/00* (2016.01)
*H01L 25/075* (2006.01)
(Continued)

(52) U.S. Cl.
CPC ............ *F21K 9/56* (2013.01); *H01L 25/0753* (2013.01); *F21K 9/90* (2013.01); *F21V 3/0463* (2013.01);
(Continued)

(58) Field of Classification Search
CPC .......... F21K 9/56; F21K 9/90; H05B 33/04; F21V 17/104; F21Y 2101/02; H01L 25/0753; H01L 2224/73265; H01L 2224/32245; H01L 33/504; H02L 2224/48091
USPC ....................................... 362/293
See application file for complete search history.

(56) References Cited

U.S. PATENT DOCUMENTS

| | | | |
|---|---|---|---|
| 8,317,348 B2 * | 11/2012 | Yoo .................... | C09K 11/0883 362/293 |
| 2010/0224895 A1 * | 9/2010 | Murazaki ........... | C09K 11/0883 257/98 |

FOREIGN PATENT DOCUMENTS

JP    2008-034188 A    2/2008
JP    2008-235921 A    10/2008
(Continued)

OTHER PUBLICATIONS

Toshihiko Ueda, "Seishokukou ni yoru Moumaku Koushougai" [Retinal Impairment Due to Blue Light], IOL & RS, Sep. 2003, pp. 344 & 345, vol. 17, No. 3, Japanese Society of Cataract and Refractive Surgery, Ibaraki-shi Japan.

(Continued)

*Primary Examiner* — Karabi Guharay
*Assistant Examiner* — Jessica M Apenteng
(74) *Attorney, Agent, or Firm* — James Judge

(57) ABSTRACT

LED lighting device in which color-mixed light according to a mixture of a blue optical emission spectrum according to the emission from an LED element, a red optical emission spectrum according to the emission from a red phosphor, and a green optical emission spectrum according to the emission from a green phosphor is emitted, wherein in the spectrum for the emitted color-mixed light, letting the relative spectral area for the principal-wavelength peak of the blue optical emission spectrum be $A_B$ and the peak emission intensity be $I_B$, letting the relative spectral area of the green optical emission spectrum be $A_G$ and the peak emission intensity be $I_G$, and letting the relative spectral area of the red optical emission spectrum be $A_R$ and the peak emission intensity be $I_R$, then $I_B < I_G$, $I_B < I_R$, $A_B \leq A_G$, $A_B \leq A_R$, and $A_B/(A_R+A_G) \leq 0.4$.

21 Claims, 9 Drawing Sheets

(51) Int. Cl.
*F21V 3/04* (2006.01)
*F21V 9/16* (2006.01)
*F21V 17/10* (2006.01)
*F21Y 101/02* (2006.01)
*H01L 33/50* (2010.01)

(52) U.S. Cl.
CPC ............... *F21V 9/16* (2013.01); *F21V 17/104* (2013.01); *F21Y 2101/02* (2013.01); *H01L 33/504* (2013.01); *H01L 2224/32245* (2013.01); *H01L 2224/45144* (2013.01); *H01L 2224/48091* (2013.01); *H01L 2224/48247* (2013.01); *H01L 2224/73265* (2013.01)

(56) References Cited

FOREIGN PATENT DOCUMENTS

| JP | 2009-260393 A | 11/2009 |
| JP | 2010-153065 A | 7/2010 |

OTHER PUBLICATIONS

Jin Co., Ltd., "Buru Raito to ha?" [What is Blue Light?], Mar. 13, 2013, http://www.jins-jp.com/jins-pc/, Japan.

* cited by examiner

REDUCED-BLUE-LIGHT LED LIGHTING DEVICE, METHOD OF ITS MANUFACTURE, AND LED LIGHTING METHOD

BACKGROUND OF THE INVENTION

1. Technical Field

The present invention relates to light-emitting diode (LED) lighting and like devices in which optical emission from a blue LED excites a phosphor, causing it to emit light.

2. Description of the Related Art

Blue LEDs that emit light having an optical emission peak at 420 nm to 490 nm wavelength have been known to date. In turn, white LED lighting devices that emit pseudo-white light by causing, via optical emission from a blue LED, yellow light to luminesce from a yellow phosphor such as emits excitation light having an optical emission peak at 550 nm to 590 nm wavelength, and mixing the blue light that the blue LED emits and the yellow light that the yellow phosphor emits have been widely employed. As the yellow phosphor, yttrium aluminum garnet (YAG) phosphors are widely employed. Such white LED lighting devices are widely employed in backlights for liquid-crystal displays and in general lighting applications.

With white LED lighting devices with a blue LED being the light source and employing a YAG phosphor as a yellow fluorescent mass, as indicated in FIG. 13, in general, blue light B from a blue LED having an optical emission peak near 460 nm, and yellow light Y that is in a complementary color relationship with the blue light, luminesced from a yellow phosphor having an optical transmission peak near 580 nm, are color-mixed so as to be in a predetermined color proportion, whereby they are adjusted so as to yield white light W on a line segment YB joining the two color coordinates. Color coordination is carried out such as to adjust the vector in the blue direction and the vector in the yellow direction so as to position them on the color coordinates of the luminesced color that is the objective. FIGS. 10 through 12 graph spectra representative of pseudo-white light obtained by color-mixing blue light from the blue LED and yellow light that is its color complement that the YAG phosphor emits. In this way, as indicated in FIG. 14, white the light that is in the American National Standards Institute (ANSI) C 78.377 region, as well as the color temperature calculated by the method set forth in the appendix to JIS Z 8725, and white light that is in the xy-coordinate range of the correlate color temperature, are obtained.

A problem with the light from white LED lighting devices in which a blue LED is the light source and that employ YAG phosphors as a yellow fluorescent mass has been that because it is just blue light and yellow light color-mixed, the device's color rendering property, compared with natural light that exhibits a broad spectrum, has been inferior. "Color rendering property" is a property of a light source that, with the light source illuminating an object, is exerted in a difference from how the colors can be seen with natural light illuminating the object. The spectrum of natural light has a wide range of spectral wavelengths. On the other hand, because pseudo-white light as described above is simply light in which yellow light and blue light are color-mixed, in illuminating an object that is red or green, being a color that either is not contained in pseudo-white light or whose contained proportion is slight, the way the color appears will differ from when natural light is shone.

As white LED lighting devices in which the color rendering property of a white LED lighting device employing a blue LED and a YAG phosphor has been improved, white LED lighting devices as, for example, disclosed in below-noted Patent Document 1 and below-noted Patent Document 2 in which, in a white LED lighting device employing a blue LED and a YAG phosphor, slight quantities of a red fluorescent mass and a green fluorescent mass have been complementarily added are known. According to such methods, further color-mixing red light and green light components in a white LED lighting device employing a blue LED and a YAG phosphor enables its spectrum to approach a natural light spectrum.

As indicated in FIG. 10 to FIG. 12, in a white LED lighting device with a blue LED being the light source and employing a YAG phosphor, a large amount of blue light in the vicinity of the principal wavelength 460 nm is contained as an essential component. Reports that among visible beams of light, blue-light wavelengths—380 nm to 495 nm wavelength—can have a negative impact on the human retina have been numerous in recent years (for example, below-noted Non-Patent Document 1). Blue light is high-energy light in the visible range having wavelengths closest to ultraviolet rays, and are reputed to reach the retina without being absorbed by the cornea or the lens of the eye.

With concern over the influence of blue light reaching to the retina, eyeglasses such as disclosed, for example, in below-noted Non-Patent Document 2, in which the blue light is selectively cut, are being marketed. It is stated that when such eyeglasses are put on and a liquid-crystal display employing a white LED lighting device is viewed, in terms of numerical values based on British standard BS2724: 1987, blue light is cut by 50% or more. In addition, wavelength filters that will by covering a liquid crystal display selectively cut blue-light wavelengths are also being marketed.

PRIOR ART LITERATURE

Patent Documents

Patent Document 1: Pat. Pub. No. 2009-260393 official gazette

Patent Document 2: Pat. Pub. No. 2008-34188 official gazette

Non-Patent Literature

Non-Patent Document 1: "Retinal Impairment Due to Blue Light," *IOL & RS*, Vol. 17, No. 3, Sept. 2003, 344-345.

Non-Patent Document 2: http://www.jins-jp.com/jins-pc/ (JIN Co., Ltd. website).

BRIEF SUMMARY OF THE INVENTION

The present invention relates to an LED lighting device including a blue LED element lent an optical emission peak in the 420 nm to 490 nm wavelength region, a green phosphor that by being excited by the emission from the blue LED element emits light having an optical emission peak in the 495 nm to 530 nm wavelength region, and a red phosphor that by being excited by the emission from the blue LED element emits light having an optical emission peak in the 595 to 680 nm wavelength region, and emitting mixed colors according to a mixture of the blue emission spectrum according to the optical emission from the blue LED element, the green emission spectrum according to the optical emission from the green phosphor, and the red emission spectrum according to the optical emission from the red phosphor, wherein letting the relative spectral area of the blue optical emission spectrum be $A_B$ and the peak emission intensity be $I_B$, letting the relative spectral area of the aforementioned green optical emission spectrum be $A_G$ and the peak emission intensity be $I_G$, and letting the relative spectral area of the aforementioned red optical emission spectrum be $A_R$ and the peak emission intensity be $I_R$, then $$I_B < I_G, I_B < I_R, A_B \leq A_G, A_B \leq A_R, \text{ and } A_B/(A_R+A_G) \leq 0.4$$

are satisfied.

In accordance with LED lighting devices of the present invention, LED lighting devices that are lighting devices in which by being excited by optical emission from a blue LED, a phosphor emits light, and in which the blue light is decreased by a large margin are made available.

DETAILED DESCRIPTION OF THE INVENTION

In order to control blue light from arriving at the retina when viewing a liquid crystal display, wearing eyeglasses that cut blue light is cumbersome, and for those who are not used to having eyeglasses on, wearing eyeglasses is stressful. Likewise, fitting onto a liquid crystal display a wavelength filter for covering the liquid crystal display can be arduous, or fitting on the wavelength filter can lead to problems of the brightness diminishing or the color balance being altered. In accordance with LED lighting devices of the present invention, lighting devices in which by being excited by optical emission from a blue LED, a phosphor emits light, and in which the blue light is decreased by a large margin are made available.

As one example, in implementations in which white light of (0.37, 0.37) xy chromaticity coordinates, for example, is put out, for the conventional case according to the combination of a blue LED and a YAG phosphor, the ratio $A_B/A_Y$ of the relative spectral area $A_B$ of a blue LED and the relative spectral area $A_Y$ of a YAG phosphor surpasses 0.4 by a wide margin. On the other hand, in accordance with a LED lighting device of the present embodying modes, $A_B/(A_R+A_G)$ can be controlled so as to be 0.03 or less, for example. As a result, even when tuning the white light in the ANSI region, white light in which blue light from a blue LED has been decreased below that of conventional white light can be obtained.

In the following, an explanation of modes embodying of the present invention will be made in detail, with references being made to the drawings.

Figure 1:
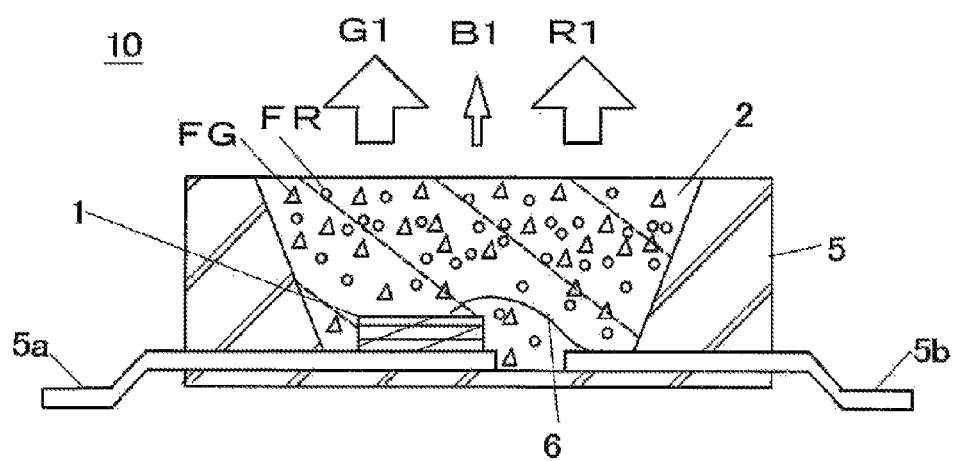
FIG. 1 is a schematic sectional view of a white LED lighting device 10 in one embodying mode involving the present invention.

FIG. 1 is a schematic sectional view schematically illustrating an LED lighting device 10 in Embodying Mode 1 involving the present invention. The LED lighting device 10 of Embodying Mode 1 is furnished with an optical-emission-mass housing member 5 having a recess, whose upper face is open-ended, in which a pair of leads 5a, 5b that extend out to the exterior are disposed, with the recess, in which an LED element 1 is housed, being sealed by a resin sealant 2 containing a red phosphor FR and a green phosphor FG. One of the electrical contacts on the LED element 1 is connected to the lead 5a, and the other of the contacts on the LED element 1 is connected to the lead 5b through wire bonding by a metal wire 6.

The LED element 1 emits a blue optical emission spectrum B1 having a principal wavelength (peak wavelength) in the 420 nm to 490 nm blue region, for example. Further, the green phosphor FG, by being excited by the optical emission in the blue emission spectrum B1 from the LED element 1, emits a green optical emission spectrum G1 having a principal wavelength (peak wavelength) in the 495 nm to 530 nm green region. And the red phosphor FR, by being excited by the optical emission in the blue emission spectrum B1 from the LED element 1, emits a red optical emission spectrum R1 having a principal wavelength (peak wavelength) in the 595 nm to 680 nm red region.

In the LED lighting device 10, with the blue light in the blue optical emission spectrum B1 being in large part consumed in the excitation of the red phosphor FR and the green phosphor FG, the emission of blue light is remarkably decreased. Meanwhile, the red light that the red phosphor FR emits and the green light that the green phosphor FG emits form, by their chromatic mixing, white or a like color.

Figure 2:
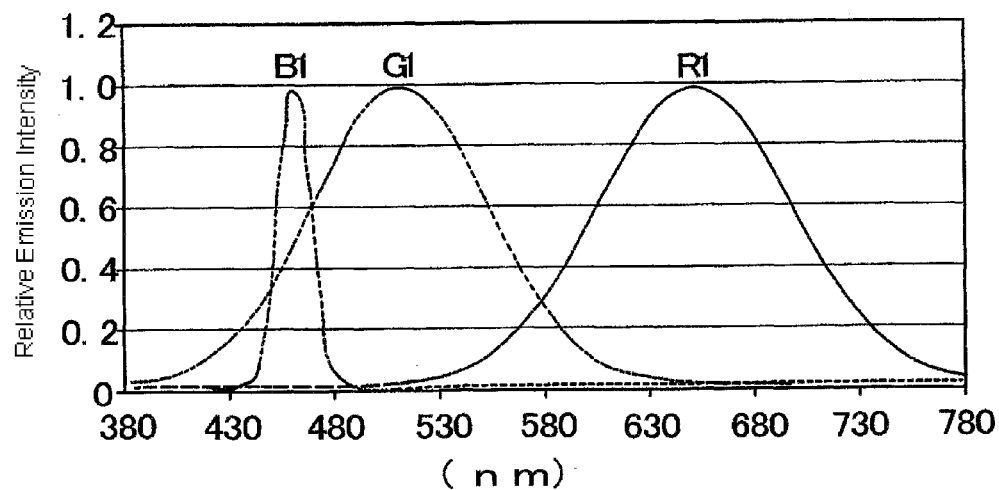
FIG. 2 charts an example of, respectively, a blue emission spectrum B1 according to the optical emission from a blue LED element 1, a green emission spectrum G1 according to the optical emission from a green phosphor G, and a red emission spectrum R1 according to the optical emission from a red phosphor R.

FIG. 2 charts one example of, respectively, a blue emission spectrum B1 according to the optical emission from the blue LED element 1, a green emission spectrum G1according to the optical emission from the green phosphor FG, and a red emission spectrum R1according to the optical emission from the red phosphor FR.

Figure 3:
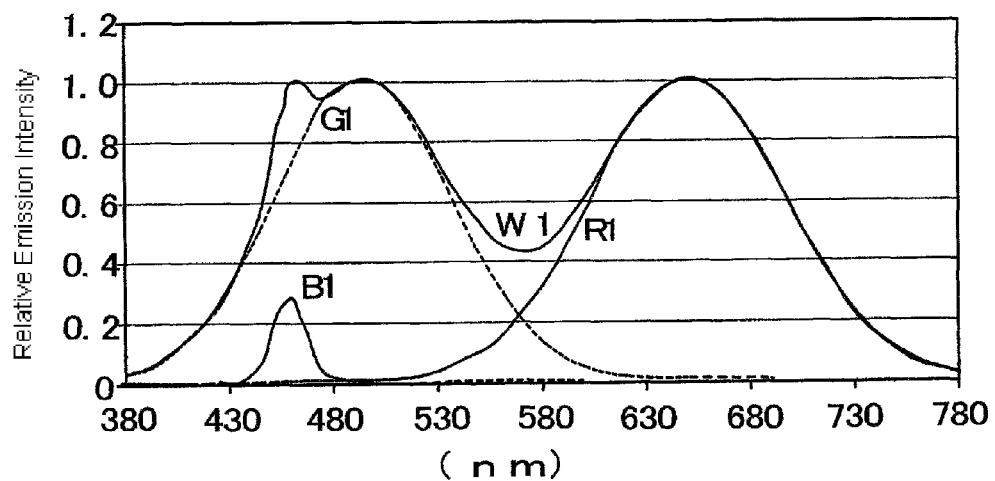
FIG. 3 charts an example of the spectrum of color-mixed light emitted from the white LED lighting device 10.

FIG. 3 charts an example of the mixed-color spectrum of light emitted from the LED lighting device 10, yielded by mixing together in predetermined proportions the blue emission spectrum B1, the red emission spectrum R1, and the green emission spectrum G1, as indicated in FIG. 2.

In order to cause the objective color to be emitted, a mixed-color spectrum W1 as indicated in FIG. 3 is generated by a mixing together of the blue emission spectrum B1, the red emission spectrum R1, and the green emission spectrum G1 at respective predetermined optical-emission rates. In the mixed-color optical emission spectrum W1 in FIG. 3, a peak in the vicinity of 460 nm wavelength in the blue emission spectrum B1, a peak in the vicinity of 495 nm wavelength in the green emission spectrum G1, and a peak in the vicinity of 650 nm wavelength in the red emission spectrum R1are present.

In the example graphed in FIG. 3 of the mixed-color optical emission spectrum for the LED lighting device 10, the relative spectral area $A_B$ of the blue emission spectrum B1 is 1.08 and the emission peak intensity $I_B$ at its 460 nm principal-wavelength peak is 0.27. Likewise, the relative spectral area $A_G$ of the green emission spectrum G1is 21.00 and the emission peak intensity $I_G$ at its 495 nm principal-wavelength peak is 1.00. Further, the relative spectral area $A_R$ of the red emission spectrum R1 is 23.02 and the emission peak intensity $I_R$ at its 650 nm principal-wavelength peak is 1.00. Thus, $A_B/(A_R+A_G)=0.025$.

Herein, "relative spectral area" of the emission spectrum for each color in the color mixture means the summation of the relative peak intensities of the wavelengths that form the spectrum for each color constituting the color mixture. And the "emission peak intensity" of the optical emission spectrum for each color in the color mixture means the relative intensity at the wavelength that exhibits the highest intensity in the emission spectrum for each color. It should be noted that for the relative spectral areas of the optical emission spectra, the spectral distribution and area for each color can be measured in advance and, by adjusting of the light synthesized from the colors so as to satisfy the peaks described above, converted to relative spectral areas from the heights of adjusted peak values.

In this way the mixed-color spectrum of light emitted from an LED lighting device of the present embodying modes satisfies, when letting $A_B$ be the relative spectral area of the blue optical emission spectrum and $I_B$ be the peak emission intensity, letting $A_G$ be the relative spectral area of the green optical emission spectrum and $I_G$ be the peak emission intensity, and letting $A_R$ be the relative spectral area of the red optical emission spectrum and $I_R$ be the peak emission intensity, $I_B<I_G$, $I_B<I_R$, $A_B \leq A_G$, $A_B \leq A_R$, and $A_B/(A_R+A_G) \leq 0.4$. In the mixed-color spectrum of the light emitted from such LED lighting devices, the light in the blue-light wavelength region proves to be, relatively, extremely slight. Accordingly, by means of an LED lighting device thus in which the blue light has been decreased, even in implementations utilizing it, for example, as a backlight for a liquid-crystal display or the like, concerns as to the negative impact of the blue light on the retina from staring at the liquid-crystal display for long hours can be dispelled.

In the mixed-color spectrum of the light emitted from an LED lighting device of the present embodying modes, $A_B/(A_R+A_G)$ is $\leq 0.4$; preferably $A_B/(A_R+A_G)$ is $\leq 0.1$; more preferably $A_B/(A_R+A_G)$ is $\leq 0.05$; particularly preferably $A_B/(A_R+A_G)$ is $\leq 0.03$; and especially preferably $A_B/(A_R+A_G)$ is $\leq 0.01$. Cases where $A_B/(A_R+A_G)$ is $>0.4$ do not allow sufficient decreasing of the blue light, such that concerns as to the negative impact of the blue light on the retina cannot be dispelled. Further, there is no particular lower limit on $A_B/(A_R+A_G)$; to the extent that 0 is approached, concern over the negative impact of blue light on the retina can be dispelled. Also, in the ANSI region that is in the range of $A_B/(A_R+A_G) \leq 0.4$, preferably $A_B/(A_R+A_G) \leq 0.1$, the fact that, in terms of light of color such as can be utilized in general lighting applications, the blue light can be decreased by a large margin is an advantage.

Further, the mixed-color spectrum of the light emitted from an LED lighting device of the present embodying mode is rendered to satisfy the conditions $I_B<I_G$, $I_B<I_R$, in order to have it be illumination light in which the blue light is decreased by a large margin.

Figure 4:
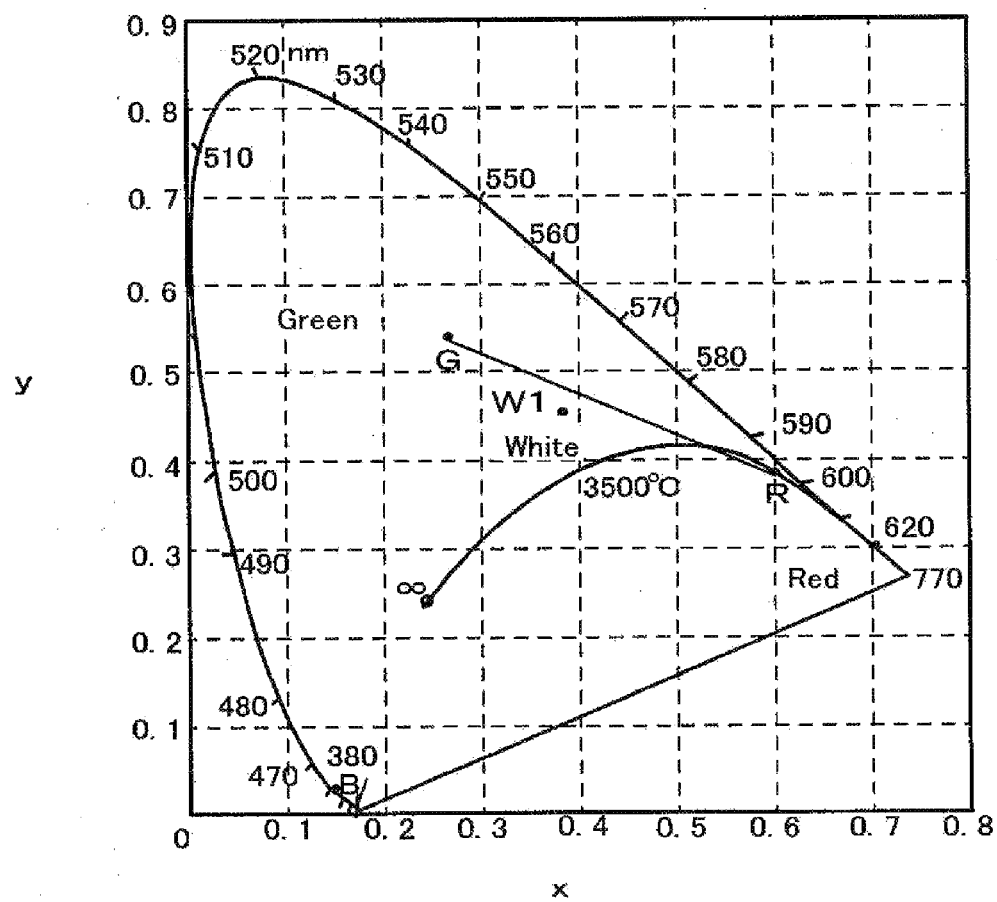
FIG. 4 charts, in xy chromaticity coordinates of a CIE color space, a coordinate G of green emission spectrum G1, a coordinate R of red emission spectrum R1, and a coordinate W1 of a mixed color spectrum, emitted from the LED lighting device 10.

FIG. 4 plots CIE color-space xy chromaticity coordinates for the color-mixed light emitted from the LED lighting device 10. In FIG. 4: the coordinate G (0.27, 0.53) indicates a color coordinate for green light in the green optical-emission spectrum G1; the coordinate R (0.60, 0.39) indicates a color coordinate for the red optical-emission spectrum R1; and the coordinate B (0.14, 0.03) indicates a color coordinate for the blue optical-emission spectrum B1. Further, the coordinate W1 (0.390, 0.445) indicates a color coordinate for the mixed-color spectrum in FIG. 3 that the LED lighting device 10 emits.

Figure 13:
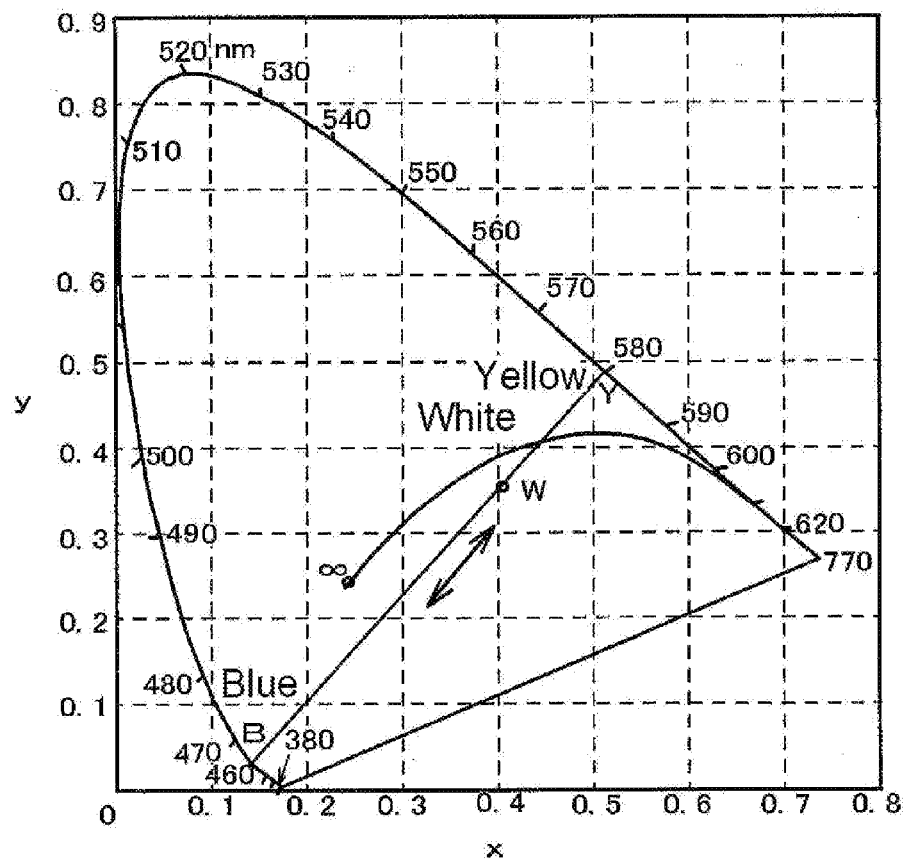
FIG. 13 is a diagram for explaining, in xy chromaticity coordinates of a CIE color space, color tuning in a conventional LED lighting device with a blue LED being the light source and employing a YAG phosphor as a yellow fluorescent mass.

As indicated in FIG. 4, in the example of the LED lighting device 10, in order to cause it to emit the color indicated by the color coordinate at coordinate W1, the compound constituents of the red phosphor and the green phosphor are adjusted so that the spectrum will be such that the ratio of the green light in the green optical-emission spectrum G1and the red light in the red optical-emission spectrum R1is as indicated in FIG. 3. On the other hand, in a conventional LED lighting device, as indicated in FIG. 13, blue light B from a blue LED having an optical-emission peak in the vicinity of 460 nm, and yellow light Y, emitted from yellow phosphor having an optical emission peak in the vicinity of 580 nm, that is in a color-complement relationship with the blue light are color-mixed so as to be in predetermined color proportions, and adjusted so as to yield white light W along line segment YB joining the two color coordinates.

In the LED lighting device of Embodying Mode 1, as one example an instance designed so as to emit white light indicated by the coordinate W1 being the color coordinate was presented, but as long as the color of the optical emission from an LED lighting device of the present embodying modes may be realized by excitation of a red phosphor FR and a green phosphor FG causing most of the blue light to be consumed, with a color mixture of fluorescent light being emitted by the excitation of the red phosphor and green phosphor, the optical emission color is not particularly limited. In particular, the device can be made to emit the color temperature calculated by the method set forth in the appendix to JIS Z 8725, and colors such as are in the xy-coordinate range of the correlate color temperature or are in the ANSI (C 78.377) region.

Figure 14:
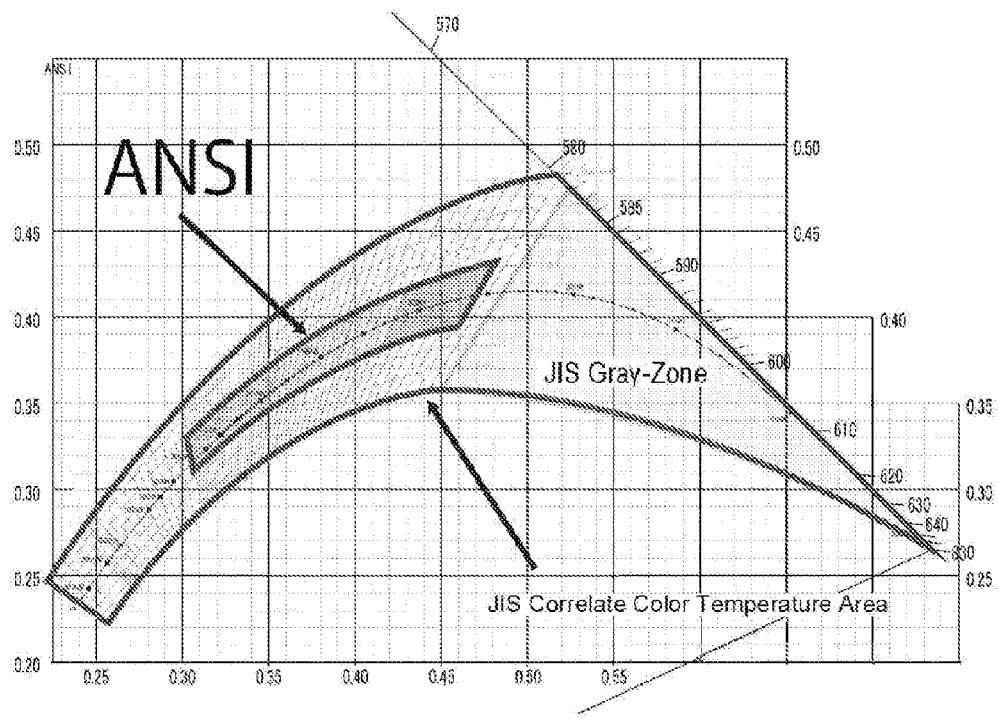
FIG. 14 is a chart graphing, in xy chromaticity coordinates of a CIE color space, optical-emission color ranges according to the ANSI standard as well as the JIS standard.

As indicated in FIG. 14, the color temperature calculated by the method set forth in the appendix to JIS Z 8725, and light that is in the xy-coordinate range of the correlate color temperature or is in the ANSI (C 78.377) region are easily utilized as a backlight for liquid-crystal displays or in general lighting applications. In implementations employing such LED lighting devices, concerns as to the negative impact on the retina from staring for long hours at a liquid-crystal display can be dispelled.

As an LED element lent an optical emission peak in the blue-light wavelength region, so-called blue LED elements such as have a principal wavelength in the range of 420 nm to 490 nm, preferably in the range of 440 nm to 480 nm, may be utilized without being particularly limited. Specific examples of blue LED elements that may be given include, for instance, GaN-based LEDs, SiC-based LEDs, ZnSe-based LEDs, and InGaN-based LEDs.

And the green phosphor may be, to cite an example, a green phosphor that, being excited by the light from an LED element having an optical-emission peak in the blue range emits green light having a principal wavelength in the 495 nm to 530 nm, preferably 495 nm to 525 nm, range. Here, in the present embodying modes, a green phosphor whose peak wavelength is comparatively short, issuing green light in a range near blue, is selected. Utilizing such a green phosphor whose peak wavelength is comparatively short makes it possible to maintain color rendering even as the blue light is decreased by a large margin.

Specific instances of such green phosphors that may be given include, for example, silicate green phosphors, aluminate green phosphors, and sialon green phosphors such as β-SiAlON:Eu. Here, in an LED lighting device of the present embodying modes, depending on the application, on account of the blue light being slight, color rendering in the region from blue to green can decline. In order to improve the color rendering from such an aspect, a green phosphor such as emits light in a short wavelength band where the peak wavelength is near blue light, specifically 495 nm to 525 nm, is particularly preferable.

And examples that may be given the red phosphor are red phosphors that, being excited by the light from an LED element having an optical emission peak in the blue region, emit red light having a principal wavelength in the range of 595 nm to 680 nm, preferably 600 nm to 650 nm. Specific examples of the red phosphor that may be given include, for instance, nitride red phosphors, silicate red phosphors, CASN red phosphors such as $CaAlSiN_3$:Eu, and sialon red phosphors.

And in order to improve the color rendering, the device may contain a YAG phosphor or other yellow phosphor such as emits excitation light having an optical-emission peak at 550 nm to 590 nm wavelength, exhibiting an optical-emission spectrum intermediate between a green optical-emission spectrum and a red optical-emission spectrum, in order to fill the spectral valley due to the color-mixing of the green emission spectrum and the red emission spectrum.

The particle diameter of the phosphors is not particularly limited, but it is preferable that the average particle diameter be 2 to 300 μm, further that it be on the order of 5 to 30 μm. Further, according to need phosphors having nano-level particle diameter may be contained.

In addition, the LED lighting device may include light-diffusing materials that scatter the light that is emitted from the blue LED element, or colorants for coloring. Specific examples of the light-diffusing material that may be given include silica, titanium oxide, aluminum oxide, calcium carbide, talc, and glass powders. And the colorant may be, to cite specific examples, pigments including cobalt blue, ultramarine and iron oxides. These may be utilized singly or may be utilized by combining two or more of the materials.

The color of the optical emission from an LED lighting device of the present embodying modes is not particularly limited as long as, with the device including, as described above, an LED element lent an optical emission peak in the blue-light wavelength region, a red phosphor that by being excited by the optical emission from the LED element emits light in the red-light wavelength region, and green phosphor that by being excited by the optical emission from the LED element emits light in the green-light wavelength region, $I_B<I_G$, $I_B<I_R$, $A_B \leq A_G$, $A_B \leq A_R$, and $A_B/(A_R+A_G) \leq 0.4$ are satisfied.

Furthermore, for the color of the optical emission from an LED lighting device of the present embodying modes, it is preferable that with respect to the total relative area of the spectrum of the mixed-color light, the relative spectral area in the region less than or equal to 480 nm wavelength be 20% or less, and further that it be 15% or less, given that, because it decreases the blue light region extremely, it allows particularly decreasing the blue light whose negative impact on the retina is of concern.

Figure 5A:
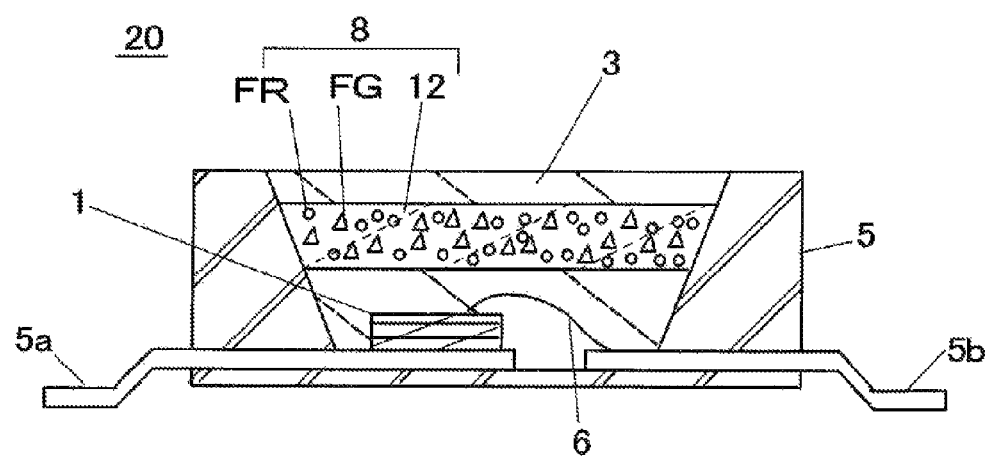
FIG. 5A is a schematic sectional view of a white LED lighting device 20 in one embodying mode involving the present invention.

It should be understood that the mode of an LED lighting device of the present embodying modes is not particularly limited. Other than a mode such as that of the LED lighting device 10 illustrated in FIG. 1, a mode such as the following may be illustrative. An example that may be given is an LED lighting device 20 such as illustrated in FIG. 5A, of a mode obtained by setting into place and sealing a phosphor-containing sheet 8. FIG. 5A is a schematic sectional view of the LED lighting device 20, where the phosphor-containing sheet 8, in which a green phosphor FG and a red phosphor FR are dispersed into a resin 12 such as silicone resin or silicone rubber and molded into sheet form, is disposed within a sealing resin 3 sealing the blue LED element 1. In the LED lighting device 20 the optical emission from the blue LED element 1 excites the green phosphor FG and the red phosphor FR within the phosphor-containing sheet 12, causing fluorescence to be emitted whereby wavelength conversion is made to take place.

Figure 5B:
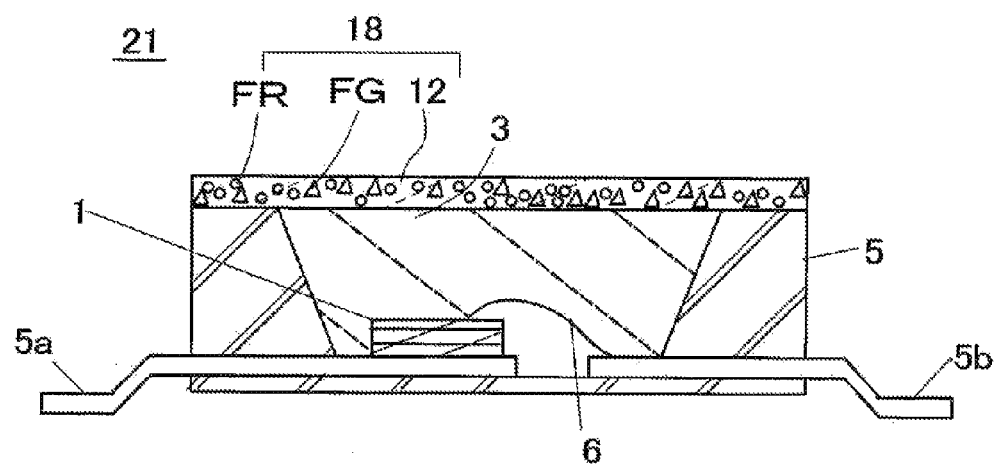
FIG. 5B is a schematic sectional view of a white LED lighting device 21 in one embodying mode involving the present invention.

In addition, as a separate mode, and LED lighting device 21 may be of a mode such that a phosphor-containing sheet 18 is set into place on the surface, as illustrated in FIG. 5B. FIG. 5B is a schematic sectional view of the LED lighting device 21, where the phosphor-containing sheet 18, in which a green phosphor FG and a red phosphor FR are dispersed into a resin 12 such as silicone resin or silicone rubber and molded into sheet form, is disposed on the surface of a sealing resin 3 sealing the blue LED element 1. In the LED lighting device 21 also the optical emission from the blue LED element 1 excites the green phosphor FG and the red phosphor FR within the phosphor-containing sheet 18, causing fluorescence to be emitted whereby wavelength conversion is made to take place.

Figure 6A:
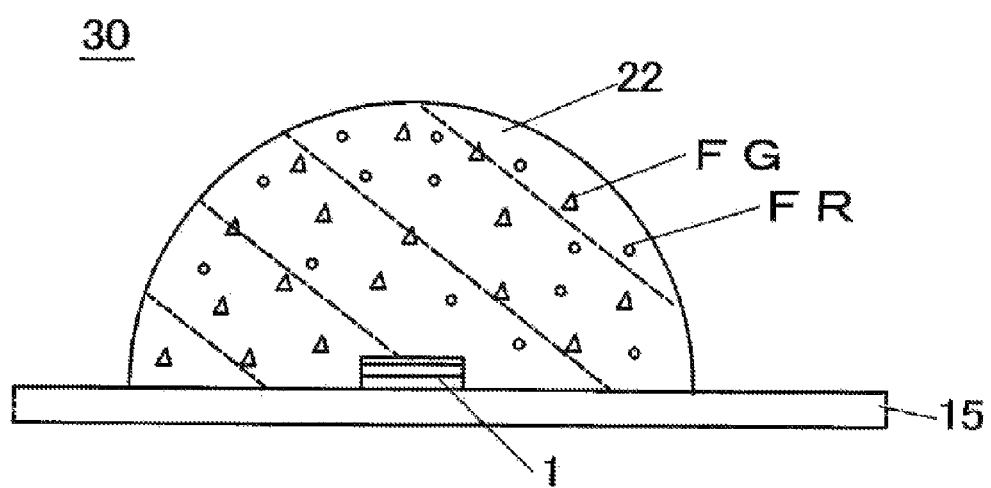
FIG. 6A is a schematic sectional view of a white LED lighting device 30 in one embodying mode involving the present invention.

Further, FIG. 6A is a schematic sectional view of an LED lighting device 30 of a chip-on-board mode. In FIG. 6A, the blue LED element 1 is surface-mounted on a circuit, whose illustration is omitted, in a circuit board 15, and the blue LED element 1 is sealed by sealing resin 22 into which a green phosphor FG and a red phosphor FR are dispersed. In the LED lighting device 30, the optical emission from the blue LED element 1 excites the green phosphor FG and the red phosphor that are dispersed throughout the sealing resin 22, causing fluorescence to be emitted, whereby wavelength conversion is made to take place. Other than the LED lighting device of the present embodying mode, the mode may be such that a cap containing a phosphor mass caps a domed LED lighting device or a blue LED lighting device. The LED lighting device may be one in which such caps or sheets are disposed in a position separated at a spacing from the blue LED element.

Figure 6B:
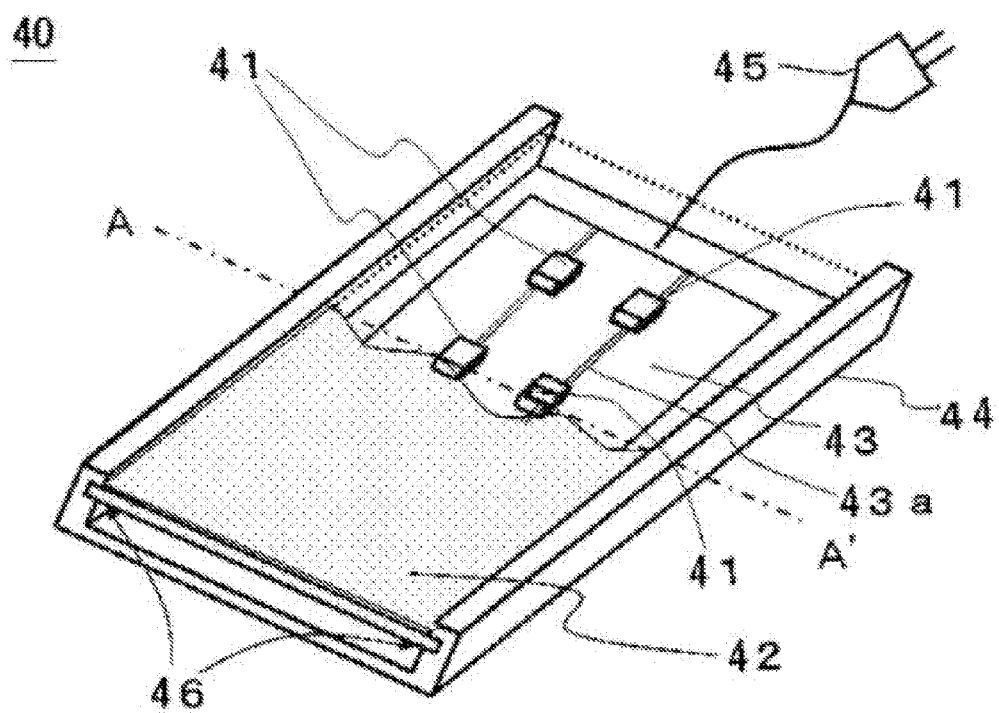
FIG. 6B is a schematic sectional view of a white LED lighting device 40 in another one embodying mode involving the present invention.
Figure 6C:
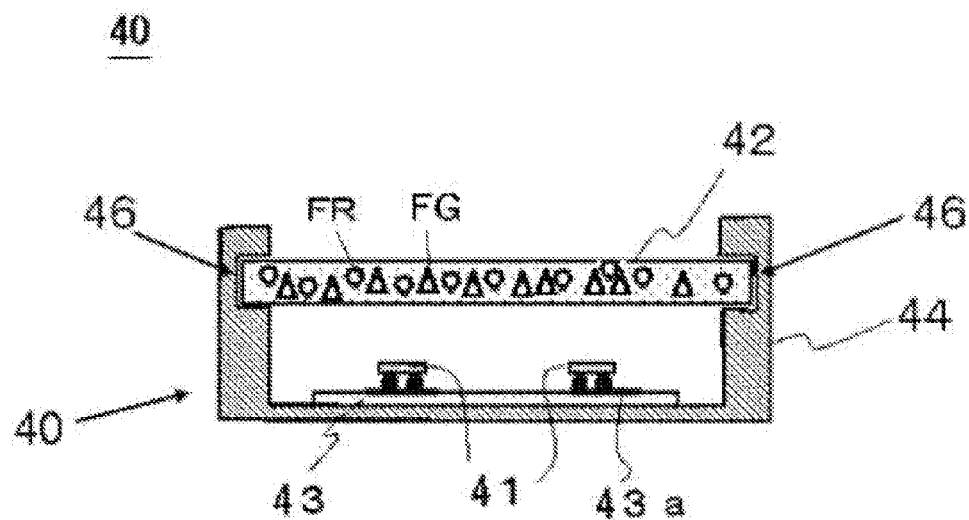
FIG. 6C is a sectional schematic diagram sectioned through A-A' in the white LED lighting device 40 of FIG. 6B.

FIG. 6B is a perspective view for explaining an LED lighting device 40 in which a phosphor-containing sheet is disposed in a position separated at a spacing from a blue LED element, and FIG. 6C is a sectional view sectioned through A-A' in the LED lighting device 40 of FIG. 6B. In FIG. 6B and FIG. 6C: 41 is a blue-light-issuing LED package containing a blue LED element 1; 42, a phosphor-containing sheet; 43, a circuit board; 43*a*, an electrical circuit formed on the surface of the circuit board 43; 44, a housing member; 45, a plug for supplying electrical power to the circuit board 43; and 46, grooves for supporting the phosphor-containing sheet 42. It will be appreciated that in FIG. 6B, in order to explain the internal structure of the LED lighting device 40, a portion of the phosphor-containing sheet 42 is represented by being see-through.

In the LED lighting device 40, a light-source unit is built on the electrical circuit 3*a* by surface-mounting a plurality of the LED packages 41 aligned rectilinearly in two rows. Then, by inserting the plug 5 into a receptacle, whose illustration is omitted, electrical power is supplied to the circuit board 43, whereby the LED packages 41 are switched on. Also, according to need, control circuitry for controlling ignition of the LED packages 41, optical sensors, electrical timers etc. may be provided on the circuit board 43. The light-source unit as such is then housed in the housing member 44. The housing member 44, on the side with the optical-emission faces of the LED packages 41, has an opening or has an optically permeable face.

The phosphor-containing sheet 42 is supported by the grooves 46 provided in the housing member 44, separated by a predetermined distance from the plurality of LED packages 41. Thus, the single-ply phosphor-containing sheet 42 covers the LED packages 41. Here, the phosphor-containing sheet 42 is supported detachably/reattachably by the grooves 46 provided in the housing member 44. The phosphor-containing sheet 42 being supported in this way by the grooves 46 facilitates its removal and installation.

Then in the LED packages 41, by electric power being supplied to the circuit board 43 through the plug 45, the LED packages 41 emit light. The blue light issuing from the LED packages 41 is then incident on the phosphor-containing sheet 42. The blue light incident on the phosphor-containing sheet 2 is then wavelength-converted by the phosphor contained in the phosphor-containing sheet 42, to a wavelength defined according to the phosphor composition.

In the LED lighting device 40, the phosphor-containing sheet 42 contains a red phosphor and green phosphor such as to satisfy $I_B < I_G$, $I_B < I_R$, $A_B \leq A_G$, $A_B \leq A_R$, and $A_B/(A_R+A_G) \leq 0.4$ in the mixed-color spectrum of the emitted light.

The mode of the phosphor-containing sheet 42 is not particularly limited as long as it is a single-ply resin sheet, containing phosphors such as described above, that covers the plurality of LED packages 41. The phosphor-containing sheet 42 may be a single-lamina sheet containing phosphors as described above or it may be a laminate in which a plurality of laminae of differing types of phosphor and compound constituents are laminated. Also, in order to improve the detach/reattachability, the phosphor-containing sheet may be laminated with a transparent resin sheet. As the transparent resin sheet, optically transmissive resin materials such as, polyolefin resins including polyethylene and polypropylene, polyethylene terephthalate (PET), polyester resins including polybutylene terephthalate (PBT), polycarbonates, polyarylates, acrylic resins, epoxy resins, and silicone resins may for example be cited.

For the thickness of the phosphor-containing sheet 42, it is preferable that it be 10 to 3000 μm, further, on the order of 50 to 500 μm.

Next, an example of a method of manufacturing an LED lighting device of the present embodying modes will be explained. In manufacturing an LED lighting device of the present embodying modes, to begin with, an LED element lent an optical emission peak in the blue-light wavelength region, issuing light having an optical-emission peak in the 420 nm to 490 nm wavelength region, a red phosphor excited by the optical emission from the LED element, emitting light in the 595 nm to 680 nm red-light wavelength region, and a green phosphor, excited by the optical emission from the just-noted LED element, emitting light in the 495 nm to 530 nm green-light wavelength region, such as described above, are prepared.

Then, the compound constituents of the red phosphor and green phosphor are determined so as to cause them to emit predetermined mixed colors according to a mixture of the blue emission spectrum according to the optical emission from the blue LED element, the red emission spectrum according to the optical emission from the red phosphor, and the green emission spectrum according to the optical emission from the green phosphor. At that time the compound constituents are determined so as to satisfy $I_B < I_G$, $I_B < I_R$, $A_B \leq A_G$, $A_B \leq A_R$, and $A_B/(A_R+A_G) \leq 0.4$.

Then the red phosphor and the green phosphor in correspondence with the compound constituents are dispersed into a transparent resin component to prepare the phosphor-resin composition. Examples of the transparent resin component that may be cited include epoxy resins, silicone rubbers, silicone elastomers, silicones including silicone resins or the like, acrylic resin, acrylic rubber, polycarbonate resin, polyolefin resins, polyester resins, and polyurethane elastomers, such as are employed as sealants for LED elements in LED lighting devices. Among these, silicone rubbers and silicone elastomers, given that discoloration and like deterioration due to long-term use is slight owing to their superior thermal resistance, lightfastness, and optical transmissivity, and that they facilitate dispersing the phosphors uniformly, are preferable. For the method of adjusting the phosphor-resin composition, a method that has been employed to date in the manufacture of LED lighting devices may be utilized without limitations in particular. Also, the hardness of the silicone rubbers or silicone elastomers preferably is JIS-A hardness 0 to JIS-A hardness 90 in JIS K6253.

The total inclusion proportion for each type of phosphor contained within the phosphor-resin composition is not particularly limited, but preferably is in 20 to 90 mass %, further 30 to 70 mass %, range. It should be understood that in order to decrease the blue light, incorporating a relatively large amount of the phosphors is preferable. Here, in order to improve the dispersiveness of the phosphors, it is preferable that the surface of the phosphors be treated with a silane coupling agent or the like.

It should be noted that when preparing the phosphor-resin composition the following sort of problem can arise. In implementations in which the phosphors have been dispersed within a low-viscosity liquid resin, according to differences in their specific gravity the phosphors will subside with elapsed time, making the dispersiveness nonuniform. In particular, in implementations in which the phosphor inclusion proportion is low, the phosphors are more liable to subside. If the phosphors have subsided, the amount of phosphor contained will vary region by region. In such instances, it is preferable to prepare a phosphor-resin composition in the form of a liquid of equal to or greater than 200 Pa·sec, preferably 1000 Pa·sec, viscosity at standard temperature, or in the form of a solid or the form of a semisolid at standard temperature. Here, the viscosity is a value measured by the Method Employing the Single-Cylinder Rotating Viscometer in conformance with JIS K7117 at standard temperature (25° C.). It should be noted that in high-viscosity cases surpassing the applicable range according to the measurement method just noted, the viscosity can be gauged by the Apparent Viscosity Test Method in conformance with JIS K2220 at standard temperature (25° C.).

As resin components of this sort, millable-type silicones, and silicones in the form of a liquid of equal to or greater than 200 Pa·sec viscosity at standard temperature may be cited. Specific examples of millable-type silicones that may be given include, for instance: "TSE-2257U," "TSE-2287U," etc. manufactured by Momentive Performance Materials Inc.; "KE-9610-U," "KE-9710-U," etc. manufactured by Shin-Etsu Chemical Co., Ltd.; and "SE-88611-CVU," "SE-8711-CVU," etc. manufactured by Dow Corning Toray Co., Ltd. And specific examples of liquid silicones of equal to or greater than 200 Pa·sec viscosity at standard temperature that may be given include, for instance, "LPS-L400," "LPS-3412," "KE-1950-70," "KEG-2000-70." (The foregoing that is within quotation marks " " are product names.)

The phosphor-resin composition having been formed in this manner is then disposed on the optical-emission region of the blue LED element. This operation may be, for example, a process step in which the blue LED element is sealed with the phosphor-resin composition, or may be a process step in which the phosphor-resin composition is molded into sheet form and the sheet is disposed on the optical-emission region of the blue LED, or may be a process step such as to apply the phosphor-resin composition onto a sealant that contains the optical-emission region of the blue LED element. Appropriate selection is made according to the mode of the LED lighting device.

LED lighting devices of the present embodying mode decrease the blue light whose negative impact on the retina has been of concern. Therefore, in implementations utilized as white light as the backlight of a liquid-crystal display or the like, or else utilized as colored light as the light source for automotive indicators, the negative impact on the retina from staring for long periods at the liquid-crystal displays or indicators may be dispelled.

EMBODIMENT EXAMPLES

Embodiment Example 1

A blue LED lighting device including a blue LED issuing blue light whose principal peak wavelength is 460 nm, positioned at color coordinates (0.14, 0.03), was prepared. Meanwhile, as indicated in the table, a phosphor-containing sheet of 0.5 mm thickness was created by evenly dispersing 90 parts by mass green phosphor and 10 parts by mass red phosphor into 100 parts by mass millable-type silicone rubber. Here, as the green phosphor, a silicate green phosphor issuing green light of 510 nm principal wavelength, positioned at coordinates (0.20, 0.43), when made into a sheet was utilized, and as the red phosphor, a nitride red phosphor issuing red light of 650 nm principal wavelength, positioned at coordinates (0.62, 0.38), when made into a sheet was utilized.

Figure 7:
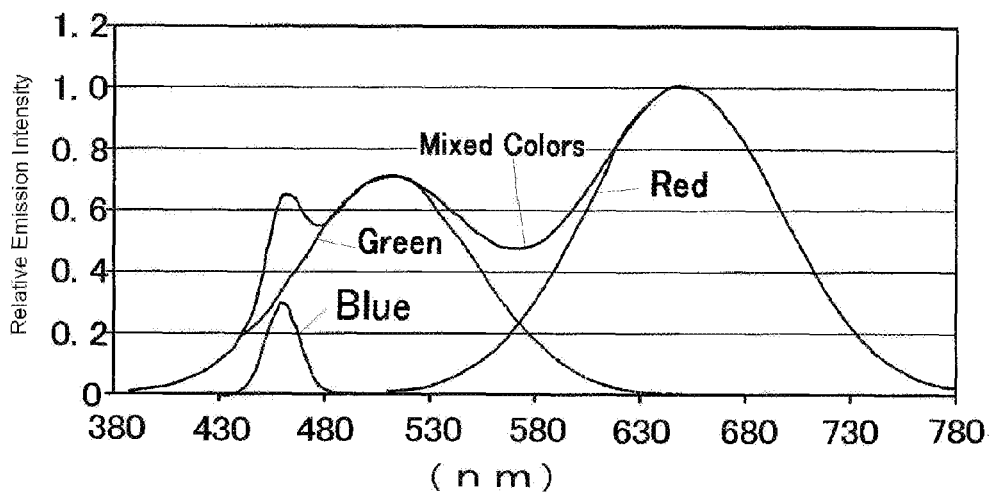
FIG. 7 charts spectra for each color forming the mixed-color light obtained in Embodiment Example 1, and a spectrum that is their color mixture.

The phosphor-containing sheet was fitted onto the optical-emission face of the blue LED lighting device and made to emit light, whereupon white light of 4000 K correlate color temperature, positioned at color coordinates (0.38, 0.38), was observed. The optical-emission spectra of each color and of the color mixture are indicated in FIG. 7. Here, the relative spectral area $A_B$ of the blue optical-emission spectrum was 1.20, with the peak emission intensity $I_B$ at its 460 nm principal-wavelength peak being 0.30; the relative spectral area $A_G$ of the green optical-emission spectrum was 14.73, with the peak emission intensity $I_G$ at its 510 nm principal-wavelength peak being 0.70; the relative spectral area $A_R$ of the red optical-emission spectrum was 23.02, with the peak emission intensity $I_R$ at its 650 nm principal-wavelength peak being 1.00; and $A_B/A_R+A_G=0.03$. And with respect to the total relative spectral area for the color-mixed light, the relative spectral area of the region less than or equal to 480 nm wavelength was 13%. The results are presented in the table.

TABLE

| Emb. Ex. No. | Emb. 1 | Emb. 2 | Emb. 3 | Comp. Ex. 1 | Comp. Ex. 2 | Comp. Ex. 3 |
|---|---|---|---|---|---|---|
| Blue LED element | | | | | | |
| Peak wavelength | | | 460 nm | | | |
| xy coordinates | | | (0.14, 0.03) | | | |
| Green phosphor | | | | | | |
| Type (peak wavelength) | silicate (510 nm) | aluminate (525 nm) | silicate (510 nm) | — | — | — |
| xy coordinates | (0.20, 0.43) | (0.26, 0.50) | (0.20, 0.43) | — | — | — |
| Compound parts | 90 | 45 | 98 | — | — | — |
| Red phosphor | | | | | | |
| Type | nitride (650 nm) | nitride (650 nm) | silicate (600 nm) | — | — | — |
| xy coordinates | (0.62, 0.38) | (0.62, 0.38) | (0.52, 0.46) | — | — | — |
| Compound parts | 10 | 11 | 1 | — | — | — |
| Yellow phosphor | | | | | | |
| Type | — | — | — | YAG (579 nm) | YAG (583 nm) | YAG (540 nm) |

TABLE-continued

| Emb. Ex. No. | Emb. 1 | Emb. 2 | Emb. 3 | Comp. Ex. 1 | Comp. Ex. 2 | Comp. Ex. 3 |
|---|---|---|---|---|---|---|
| xy coordinates | — | — | — | (0.47, 0.51) | (0.48, 0.50) | (0.32, 0.48) |
| Compound parts | — | — | — | 43 | 53 | 53 |
| $A_B$ | 1.20 | 1.60 | 0.40 | 4.01 | 4.01 | 4.01 |
| $A_G$ | 14.73 | 12.63 | 21.04 | — | — | — |
| $A_R$ | 23.02 | 23.02 | 6.92 | — | — | — |
| $A_Y$ | — | — | — | 15.37 | 19.6 | 21.54 |
| $A_B/(A_G + A_R)$ | 0.03 | 0.05 | 0.01 | — | — | — |
| $A_R/A_Y$ | — | — | — | 0.261 | 0.20 | 0.20 |
| $I_B$ | 0.30 | 0.58 | 0.10 | 1.00 | 1.00 | 1.00 |
| $I_G$ | 0.70 | 0.60 | 1.00 | — | — | — |
| $I_R$ | 1.00 | 1.00 | 0.30 | — | — | — |
| $I_Y$ | — | — | — | 0.73 | 0.93 | 1.01 |
| xy coordinates | (0.38, 0.38) | (0.41, 0.39) | (0.28, 0.42) | (0.38, 0.38) | (0.41, 0.39) | (0.28, 0.42) |
| Color temperature or correlate color temperature (K) | 4000 | 3500 | Green | 4000 | 3500 | Green |

Embodiment Example 2

A blue LED lighting device including a blue LED issuing blue light whose principal peak wavelength is 460 nm, positioned at color coordinates (0.14, 0.03), was prepared. Meanwhile, as indicated in the table, a phosphor-containing sheet of 0.5 mm thickness was created by evenly dispersing 45 parts by mass green phosphor and 11 parts by mass red phosphor into 100 parts by mass millable-type silicone rubber. Here, as the green phosphor, an aluminate green phosphor issuing green light of 525 nm principal wavelength, positioned at coordinates (0.26, 0.50), when made into a sheet was utilized, and as the red phosphor, a nitride red phosphor issuing red light of 650 nm principal wavelength, positioned at coordinates (0.62, 0.38), when made into a sheet was utilized.

Figure 8:
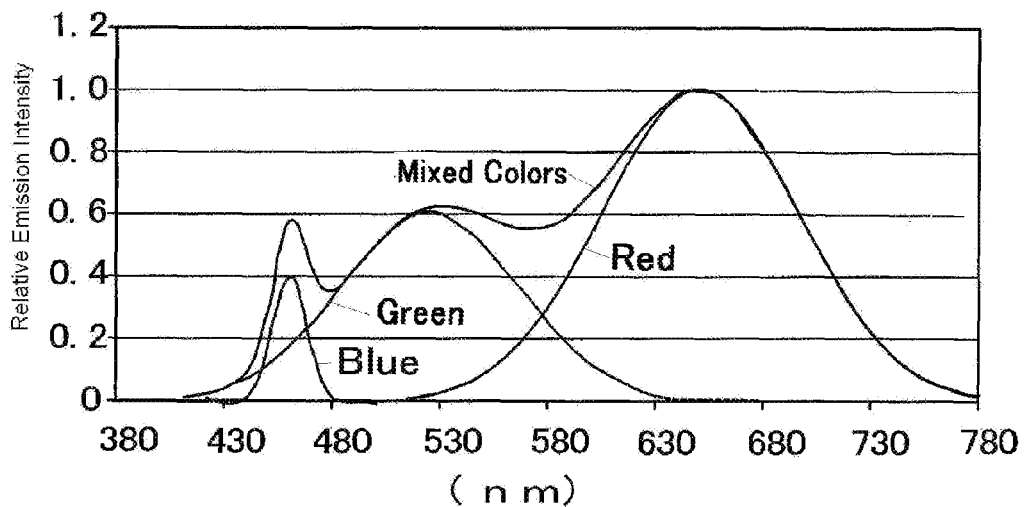
FIG. 8 charts spectra for each color forming the mixed-color light obtained in Embodiment Example 2, and a spectrum that is their color mixture.

The phosphor-containing sheet was fitted onto the optical-emission face of the blue LED lighting device and made to emit light, whereupon white light of 3500 K correlate color temperature, positioned at color coordinates (0.41, 0.39), was observed. The optical-emission spectra of each color and of the color mixture are indicated in FIG. 8. Here, the relative spectral area $A_B$ of the blue optical-emission spectrum was 1.60, with the peak emission intensity $I_B$ at its 460 nm principal-wavelength peak being 0.40; the relative spectral area $A_G$ of the green optical-emission spectrum was 12.63, with the peak emission intensity $I_G$ at its 525 nm principal-wavelength peak being 0.60; the relative spectral area $A_R$ of the red optical-emission spectrum was 23.02, with the peak emission intensity $I_R$ at its 650 nm principal-wavelength peak being 1.00; and $A_B/A_R+A_G=0.05$. And with respect to the total relative spectral area for the color-mixed light, the relative spectral area of the region less than or equal to 480 nm wavelength was 10%. The results are presented in the table.

Embodiment Example 3

A blue LED lighting device including a blue LED issuing blue light whose principal peak wavelength is 460 nm, positioned at color coordinates (0.14, 0.03), was prepared. Meanwhile, as indicated in the table, a phosphor-containing sheet of 0.5 mm thickness was created by evenly dispersing 98 parts by mass green phosphor and 1 parts by mass red phosphor into 100 parts by mass millable-type silicone rubber. Here, as the green phosphor, a silicate green phosphor issuing green light of 510 nm principal wavelength positioned at coordinates (0.20, 0.43) when made into a sheet was utilized, and as the red phosphor, a silicate red phosphor issuing red light of 600 nm principal wavelength positioned at coordinates (0.52, 0.46) when made into a sheet was utilized.

Figure 9:
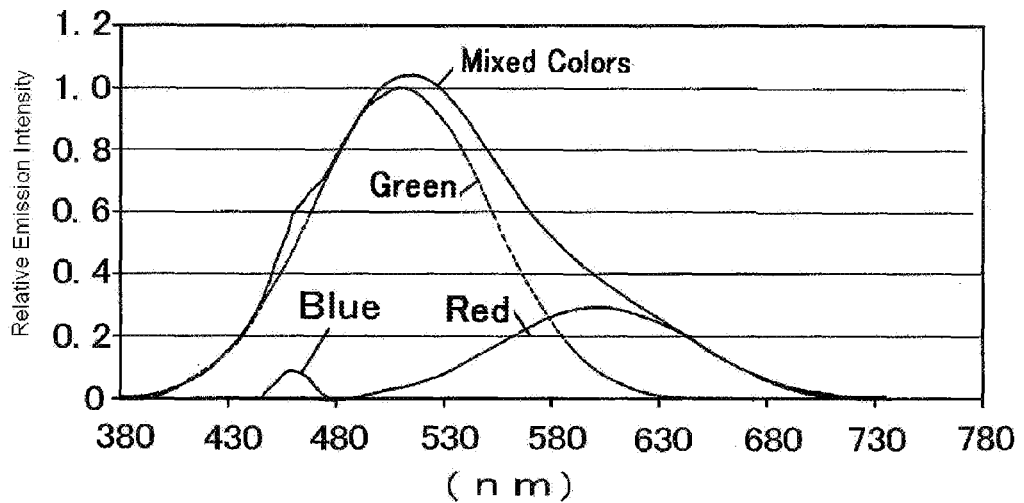
FIG. 9 charts spectra for each color forming the mixed-color light obtained in Embodiment Example 3, and a spectrum that is their color mixture.

The phosphor-containing sheet was fitted onto the optical-emission face of the blue LED lighting device and made to emit light, whereupon green light positioned at color coordinates (0.28, 0.42) was observed. The optical-emission spectra of each color and of the color mixture are indicated in FIG. 9. Here, the relative spectral area $A_B$ of the blue optical-emission spectrum was 0.40, with the peak emission intensity $I_B$ at its 460 nm principal-wavelength peak being 0.10; the relative spectral area $A_G$ of the green optical-emission spectrum was 21.04, with the peak emission intensity $I_G$ at its 525 nm principal-wavelength peak being 1.00; the relative spectral area $A_R$ of the red optical-emission spectrum was 6.92, with the peak emission intensity $I_R$ at its 650 nm principal-wavelength peak being 0.30; and $A_B/A_R+A_G=0.01$. And with respect to the total relative spectral area for the color-mixed light, the relative spectral area of the region less than or equal to 480 nm wavelength was 20%. The results are presented in the table.

Comparative Example 1

A blue LED lighting device including a blue LED issuing blue light whose principal peak wavelength is 460 nm, positioned at color coordinates (0.14, 0.03), was prepared. Meanwhile, as indicated in the table, a phosphor-containing sheet of 0.5 mm thickness was created by evenly dispersing 43 parts by mass yellow phosphor into 100 parts by mass millable-type silicone rubber. Here, as the yellow phosphor, a YAG yellow phosphor issuing yellow light of 579 nm principal wavelength positioned at coordinates (0.47, 0.51) when made into a sheet was utilized.

Figure 10:
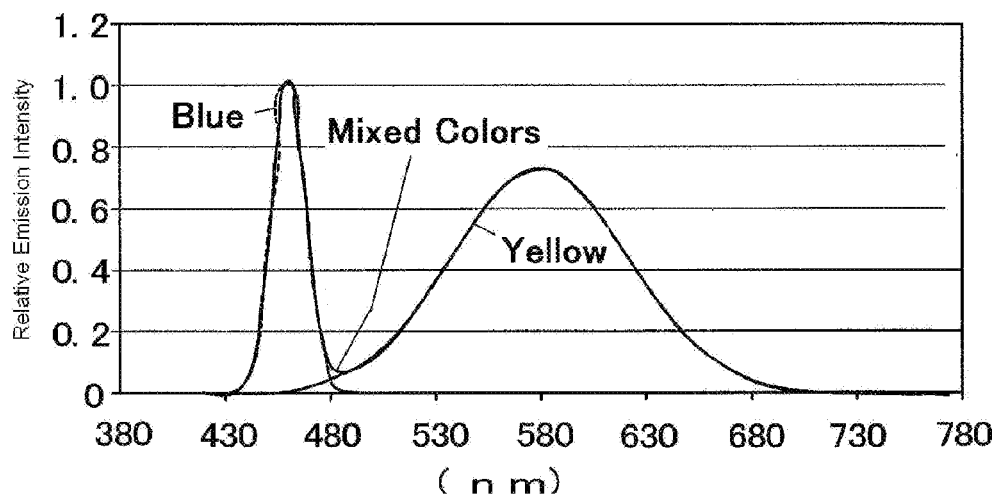
FIG. 10 charts spectra for each color forming the mixed-color light obtained in Comparative Example 1, and a spectrum that is their color mixture.

The phosphor-containing sheet was fitted onto the optical-emission face of the blue LED lighting device and made to emit light, whereupon white light of 4000 K correlate color temperature, positioned at color coordinates (0.38, 0.38) was observed. The optical-emission spectra of each color and of the color mixture are indicated in FIG. 10. Here, the relative spectral area $A_B$ of the blue optical-emission spectrum was 4.01, with the peak emission intensity $I_B$ at its 460 nm principal-wavelength peak being 1.00; the relative spectral area $A_Y$ of the yellow optical-emission spectrum was 15.37, with the peak emission intensity $I_Y$ at its 579 nm principal-wavelength peak being 0.73; and $A_B/A_Y=0.26$. And with respect to the total relative spectral area for the color-mixed light, the relative spectral area of the region less than or equal to 480 nm wavelength was 21%. The results are presented in the table.

Comparative Example 2

A blue LED lighting device including a blue LED issuing blue light whose principal peak wavelength is 460 nm, positioned at color coordinates (0.14, 0.03), was prepared. Meanwhile, as indicated in the table, a phosphor-containing sheet of 0.5 mm thickness was created by evenly dispersing 53 parts by mass yellow phosphor into 100 parts by mass millable-type silicone rubber. Here, as the yellow phosphor, a YAG yellow phosphor issuing yellow light of 583 nm principal wavelength positioned at coordinates (0.48, 0.50) when made into a sheet was utilized.

Figure 11:
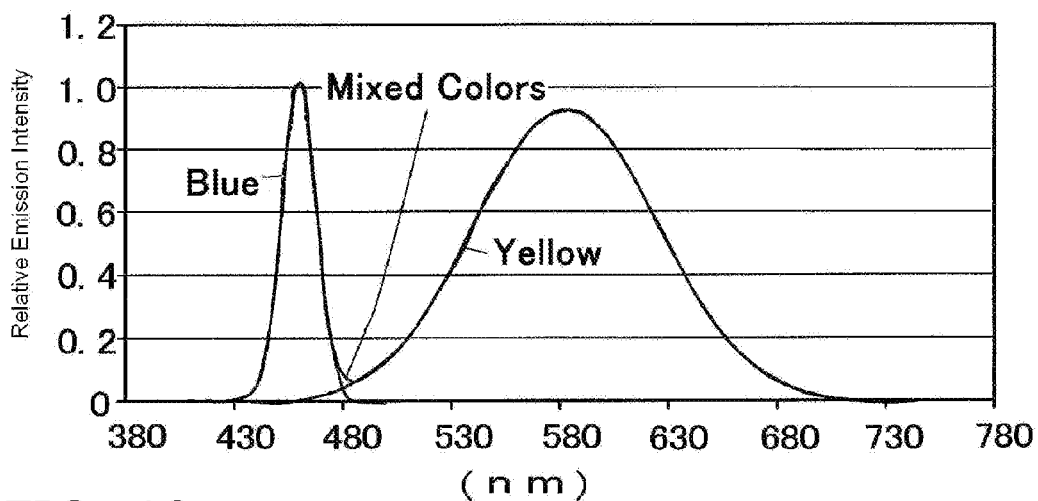
FIG. 11 charts spectra for each color forming the mixed-color light obtained in Comparative Example 2, and a spectrum that is their color mixture.

The phosphor-containing sheet was fitted onto the optical-emission face of the blue LED lighting device and made to emit light, whereupon white light of 3500 K correlate color temperature, positioned at color coordinates (0.41, 0.39) was observed. The optical-emission spectra of each color and of the color mixture are indicated in FIG. 11. Here, the relative spectral area $A_B$ of the blue optical-emission spectrum was 4.01, with the peak emission intensity $I_B$ at its 460 nm principal-wavelength peak being 1.00; the relative spectral area $A_B$ of the yellow optical-emission spectrum was 19.60, with the peak emission intensity $I_Y$ at its 583 nm principal-wavelength peak being 0.93; and $A_B/A_Y=0.20$. And with respect to the total relative spectral area for the color-mixed light, the relative spectral area of the region less than or equal to 480 nm wavelength was 17%. The results are presented in the table.

Comparative Example 3

A blue LED lighting device including a blue LED issuing blue light whose principal peak wavelength is 460 nm, positioned at color coordinates (0.14, 0.03), was prepared. Meanwhile, as indicated in the table, a phosphor-containing sheet of 0.5 mm thickness was created by evenly dispersing 53 parts by mass yellow phosphor into 100 parts by mass millable-type silicone rubber. Here, as the yellow phosphor, a YAG yellow phosphor issuing yellow light of 540 nm principal wavelength positioned at coordinates (0.32, 0.48) when made into a sheet was utilized.

Figure 12:
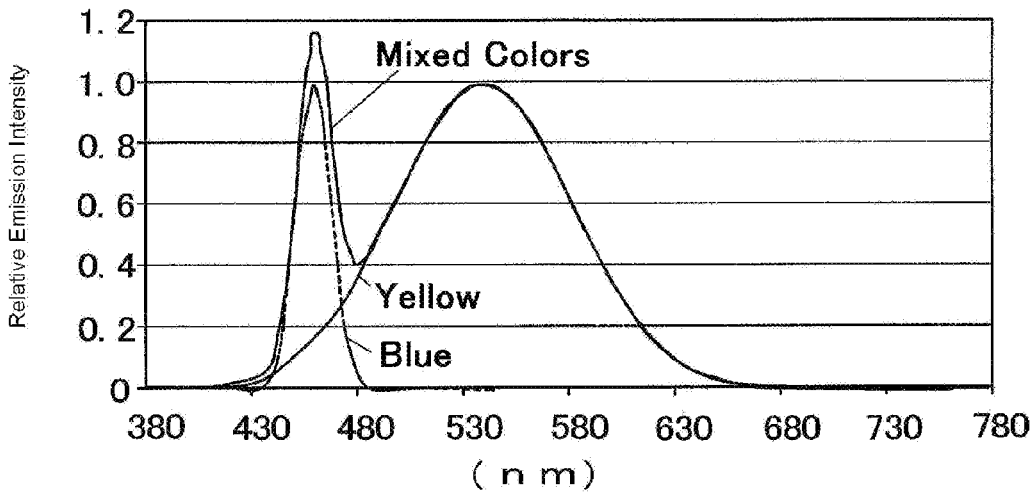
FIG. 12 charts spectra for each color forming the mixed-color light obtained in Comparative Example 3, and a spectrum that is their color mixture.

The phosphor-containing sheet was fitted onto the optical-emission face of the blue LED lighting device and made to emit light, whereupon green light positioned at color coordinates (0.28, 0.43) was observed. The optical-emission spectra of each color and of the color mixture are indicated in FIG. 12. Here, the relative spectral area $A_B$ of the blue optical-emission spectrum was 4.01, with the peak emission intensity $I_B$ at its 460 nm principal-wavelength peak being 1.00; the relative spectral area $A_Y$ of the yellow optical-emission spectrum was 21.54, with the peak emission intensity I at its 540 nm principal-wavelength peak being 1.01; and $A_B/A_Y=0.20$. And with respect to the total relative spectral area for the color-mixed light, the relative spectral area of the region less than or equal to 480 nm wavelength was 23%. The results are presented in the table.

Embodiment Example 1 and Comparative Example 1 in either case emit white light of 4000 K correlate color temperature; Embodiment Example 2 and Comparative Example 2 in either case emit white light of 3500 K correlate color temperature; and Embodiment Example 3 and Comparative Example 3 in either case emit green light. From comparing the respectively corresponding embodiment examples and comparative examples, it can be understood that even though light of the same color is being emitted, in the embodiment examples the proportion of blue light, whose negative impact on the retina has been of concern, is remarkably decreased.

What is claimed is:
1. An LED lighting device including:
   a blue LED element emitting light having an optical emission peak in the 420 nm to 490 nm wavelength region;
   a green phosphor that by being excited by the emission from said blue LED element emits light having an optical emission peak in the 495 nm to 530 nm wavelength region; and
   a red phosphor that by being excited by the emission from said blue LED element emits light having an optical emission peak in the 595 to 680 nm wavelength region;
   the LED lighting device emitting color-mixed light according to a mixture of the blue emission spectrum according to the optical emission from said blue LED element, the green emission spectrum according to the optical emission from said green phosphor, and the red emission spectrum according to the optical emission from said red phosphor; wherein
   letting the relative spectral area of the blue optical emission spectrum be $A_B$ and the peak emission intensity be $I_B$, letting the relative spectral area of the green optical emission spectrum be $A_G$ and the peak emission intensity be $I_G$, and letting the relative spectral area of the red optical emission spectrum be $A_R$ and the peak emission intensity be $I_R$, then

$I_B<I_G, I_B<I_R, A_B\leq A_G, A_B\leq A_R$, and $A_B/(A_R+A_G)\leq 0.4$ are satisfied.
2. The LED lighting device as set forth in claim 1, wherein $A_B/(A_R+A_G)\leq 0.1$.
3. The LED lighting device as set forth in claim 1, wherein $A_B/(A_R+A_G)\leq 0.05$.
4. The LED lighting device as set forth in claim 1, wherein with respect to the total relative spectral area for the color-mixed light, the relative spectral area of the region less than or equal to 480 nm wavelength is less than or equal to 20%.
5. The LED lighting device as set forth in claim 1, wherein with respect to the total relative spectral area for the color-mixed light, the relative spectral area of the region less than or equal to 480 nm wavelength is less than or equal to 15%.
6. The LED lighting device as set forth in claim 1, further including a yellow phosphor that by being excited by the emission from said blue LED element emits light having an optical emission peak in the 550 nm to 590 nm wavelength region.
7. The LED lighting device as set forth in claim 1, wherein the emission color of the color-mixed light is a color temperature calculated by the method set forth in the appendix to JIS Z 8725, and is in the xy-coordinate range of the correlate color temperature or is in the ANSI (C 78.377) region.
8. The LED lighting device as set forth in claim 1, including a resin sealant sealing said blue LED element; wherein said red phosphor and said green phosphor are compounded into said resin sealant.
9. The LED lighting device as set forth in claim 8, wherein said resin sealant is silicone.
10. The LED lighting device as set forth in claim 1, further including either a resin sheet or a resin cap for wavelength-converting light from said blue LED element; wherein said red phosphor and said green phosphor are compounded into said resin sheet or said resin cap.

11. The LED lighting device as set forth in claim 10, including a resin sealant sealing said blue LED element; wherein said resin sheet is sealed within said resin sealant.

12. The LED lighting device as set forth in claim 10, including a resin sealant sealing said blue LED element; wherein said resin sheet or said resin cap is disposed such as to cover said resin sealant.

13. The LED lighting device as set forth in claim 10, further comprising:
- a light-source unit furnished with a circuit board and a plurality of LED packages containing said blue LED element, installed on said circuit board;
- a housing member housing said light-source unit; and
- said resin sheet in at least a single ply, disposed so as to cover said plurality of light-emitting diodes, and containing phosphors in order to wavelength-convert the optical emission from said blue LED elements and output the wavelength-converted light to the exterior.

14. The LED lighting device as set forth in claim 10, wherein said resin sheet or said resin cap includes silicone.

15. The LED lighting device as set forth in claim 10, including a resin sealant sealing said blue LED element; wherein said resin sheet or said resin cap is disposed in a position separated at a spacing from the blue LED element.

16. A method of manufacturing an LED lighting device, the method comprising:
- a step of preparing a blue LED element emitting light having an optical emission peak in the 420 nm to 490 nm wavelength region, a green phosphor that by being excited by the emission from the blue LED element emits light having an optical emission peak in the 495 nm to 530 nm wavelength region, and a red phosphor that by being excited by the emission from the blue LED element emits light having an optical emission peak in the 595 nm to 680 nm wavelength region;
- a step of determining compound constituents of the green phosphor and the red phosphor such as to cause emission of predetermined color-mixed light according to a mixture of the blue emission spectrum according to the optical emission from the blue LED element, the green emission spectrum according to the optical emission from the green phosphor, and the red emission spectrum according to the optical emission from the red phosphor;
- a step of preparing a phosphor-resin composition by dispersing into a transparent resin component the red phosphor and the green phosphor in correspondence with the compound constituents; and
- a step of disposing the phosphor-resin composition on the optical-emission region of the LED element; wherein letting the relative spectral area of the blue optical emission spectrum be $A_B$ and the peak emission intensity be $I_B$, letting the relative spectral area of the green optical emission spectrum be $A_G$ and the peak emission intensity be $I_G$, and letting the relative spectral area of the red optical emission spectrum be $A_R$ and the peak emission intensity be $I_R$, the compound constituents are determined such as to satisfy $$I_B < I_G, I_B < I_R, A_B \leq A_G, A_B \leq A_R, \text{ and } A_B/(A_R+A_G) \leq 0.4.$$

17. The LED lighting device manufacturing method set forth in claim 16, wherein said step of disposing the phosphor-resin composition on the optical-emission region of the LED element is a step of sealing the blue LED element with said phosphor-resin composition.

18. The LED lighting device manufacturing method set forth in claim 16, wherein said step of disposing the phosphor-resin composition on the optical-emission region of the LED element is a process in which the phosphor-resin composition is molded either into sheet form or cap form, and a process of disposing the phosphor-resin composition having been molded into sheet form or cap form on the optical-emission region of the LED element.

19. An LED lighting method comprising:
- a step of causing a blue LED element to emit light having an optical emission peak in the 420 nm to 490 nm wavelength region;
- a step of exciting, by means of the emission from the blue LED element, green phosphor that emits light having an optical emission peak in the 495 nm to 530 nm wavelength region, and a red phosphor that emits light having an optical emission peak in the 595 to 680 nm wavelength region, to cause the phosphor to emit light; and
- a step of causing chromatic mixing according to a mixture of the blue emission spectrum according to the optical emission from the blue LED element, the green emission spectrum according to the optical emission from the green phosphor, and the red emission spectrum according to the optical emission from the red phosphor; wherein letting the relative spectral area of the blue optical emission spectrum be $A_B$ and the peak emission intensity be $I_B$,
letting the relative spectral area of the green optical emission spectrum be $A_G$ and the peak emission intensity be $I_G$, and letting the relative spectral area of the red optical emission spectrum be $A_R$ and the peak emission intensity be $I_R$, $$I_B < I_G, I_B < I_R, A_B \leq A_G, A_B \leq A_R, \text{ and } A_B/(A_R+A_G) \leq 0.4$$

are satisfied.

20. The LED lighting method set forth in claim 19, wherein $A_B/(A_R+A_G) \leq 0.1$.

21. The LED lighting method set forth in claim 19, wherein with respect to the total relative spectral area for the color-mixed light, the relative spectral area of the region less than or equal to 480 nm wavelength is less than or equal to 20%.

* * * * *